US008466690B2

(12) United States Patent
Stewart et al.

(10) Patent No.: US 8,466,690 B2
(45) Date of Patent: Jun. 18, 2013

(54) HIGH VOLTAGE INSULATION MONITORING SENSOR

(75) Inventors: Brian G. Stewart, Wisuan (GB); Alan Nesbitt, Glasgow (GB); Scott G. McMeekin, Glasgow (GB)

(73) Assignee: University Court of Glasgow Caledonian University, Glasgow (GB)

( * ) Notice: Subject to any disclaimer, the term of this patent is extended or adjusted under 35 U.S.C. 154(b) by 716 days.

(21) Appl. No.: 12/065,721

(22) PCT Filed: May 9, 2006

(86) PCT No.: PCT/GB2006/003282
§ 371 (c)(1),
(2), (4) Date: Aug. 29, 2008

(87) PCT Pub. No.: WO2007/028977
PCT Pub. Date: Mar. 15, 2007

(65) Prior Publication Data
US 2008/0309351 A1    Dec. 18, 2008

(30) Foreign Application Priority Data
Sep. 5, 2005   (GB) .................................. 0517994.0

(51) Int. Cl.
*H01H 31/12* (2006.01)
(52) U.S. Cl.
USPC ....................................................... 324/551
(58) Field of Classification Search
USPC ................. 324/536, 541, 544, 546, 547, 551, 324/552; 700/286–298
See application file for complete search history.

(56) References Cited

U.S. PATENT DOCUMENTS

| 3,622,872 | A |   | 11/1971 | Boaz |
|---|---|---|---|---|
| 4,757,263 | A |   | 7/1988 | Cummings, III et al. |
| 4,929,842 | A | * | 5/1990 | ter Haseberg et al. .......... 250/551 |
| 5,107,447 | A | * | 4/1992 | Ozawa et al. ................... 702/58 |
| 5,172,067 | A | * | 12/1992 | Hoffmann ..................... 324/713 |
| 5,247,258 | A |   | 9/1993 | Tripier et al. |
| 5,898,239 | A | * | 4/1999 | Kawam ......................... 307/130 |
| 6,028,430 | A |   | 2/2000 | Frielingsdorf |
| 6,088,205 | A |   | 7/2000 | Neiger et al. |

(Continued)

FOREIGN PATENT DOCUMENTS

JP           03134576 A1   6/1991
WO      2004/034070 A     4/2004

OTHER PUBLICATIONS

Horowitz et al., The Art of Electronics, Second Edition, Cambridge University Press, 1989, p. 55.*

Primary Examiner — Melissa Koval
Assistant Examiner — Daniel Miller
(74) Attorney, Agent, or Firm — Workman Nydegger

(57) ABSTRACT

A sensor for condition monitoring the high voltage insulation of an electrical, generation, transmission or distribution system and/or an item of plant is described. The sensor comprises an impedance measurement unit that connects directly, via a single point of connection, to the electrical system to be tested. The electrical components of the impedance measurement unit are arranged so that high frequency partial discharge signals and low frequency power cycle information signal are preferentially transmitted through separate branches. Analysis of these separated signals thus enables extraction of information about the insulation of the electrical system being monitored. Safe operation of the sensor for users is also achieved through an opto-electronic circuit being employed to control the impedance measuring unit.

25 Claims, 7 Drawing Sheets

U.S. PATENT DOCUMENTS

Figure 1:
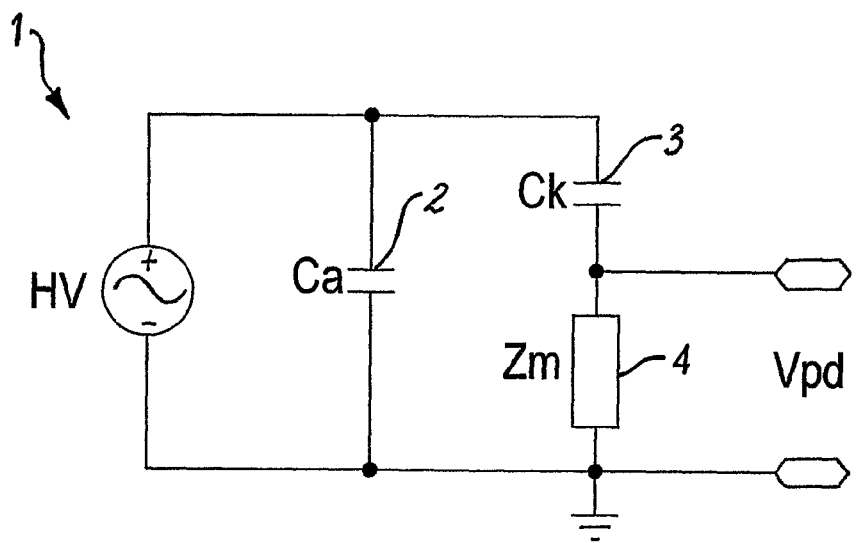

| | | | |
|---|---|---|---|
| 6,130,540 A * | 10/2000 | Achatz | 324/536 |
| 6,313,640 B1 | 11/2001 | Nasrallah et al. | |
| 6,433,557 B1 | 8/2002 | Rashkes et al. | |
| 6,489,782 B1 | 12/2002 | Baier et al. | |
| 6,504,382 B2 | 1/2003 | Smith et al. | |
| 6,580,276 B2 | 6/2003 | Hilal | |
| 6,927,562 B2 * | 8/2005 | Anand et al. | 324/126 |
| 2004/0130328 A1 * | 7/2004 | Koo et al. | 324/536 |

* cited by examiner

HIGH VOLTAGE INSULATION MONITORING SENSOR

The present invention relates to the field of high voltage insulation monitoring and in particular to a sensor for condition monitoring of the high voltage insulation of an electrical, generation, transmission or distribution system and/or an item of plant.

Partial discharges are small sparks which provide an important measure of the state of insulation within a high voltage electrical generation, transmission and distribution system or item of plant. Partial discharges occur as insulation starts to deteriorate and once prevalent, become the predominant source of insulation breakdown. Partial discharges can also occur in high voltage systems due to floating particles, voids in insulation, loose connectors, burrs and sharp points. The need to monitor partial discharges is critical in attempts to evaluate the state of a fault or the state of insulation and also in trying to evaluate the lifetime of the plant item itself. Being able to monitor reliably partial discharges facilitates the administration of planned shut downs, required to carry out replacement or maintenance of component parts, in a cost effective manner while still providing an efficient electricity service to end users.

A second diagnostic associated with electrical distributions and/or items of plant is power cycle information. Power cycle information is important for two reasons. Firstly, this information helps in interpreting and understanding the mechanisms and particular faults associated with certain patterns of partial discharge. It is known that patterns of particular faults can be constructed based on the size of individual partial discharge events, their frequency of occurrence and also on the precise phase locations at which they occur within individual power cycles. Such patterns are referred to in the state of the art as Φ-q-n patterns, relating to phase on the cycle, apparent charge associated with the partial discharge event and the frequency of occurrence at that phase. In particular, it has been possible to differentiate between corona, surface discharges, void discharges and floating point discharges from an understanding of these discharge patterns.

The second reason why power cycle information is important relates to the fact that knowing the power cycle waveform allows the power quality to be evaluated. Power quality measurements for distribution systems are outlined in the EN/IEC 50160 Standard entitled "Voltage characteristics of electricity supplied by public distribution systems". This standard outlines the specific regulations relating to power quality, and in particular, refers to monitoring of the power frequency, supply voltage variations, rapid supply voltage changes, voltage dips, over voltages, harmonic content, inter-harmonic content between phases etc. The IEEE 1159 Standard entitled, "Recommended Practice on Monitoring Electrical Power Quality", outlines seven basic categories for monitoring power quality i.e. transients, short-duration variations, long-duration variations, voltage imbalance, waveform distortion, voltage fluctuations and power frequency variations.

When harmonic distortion and voltage changes occur within the power cycle this is normally related to saturation or over-driving of the system and is indicative of over loading or a major fault within the generation of power. If this is not addressed it can have serious consequences on how other pieces of plant will function as well as interfering with equipment used by commercial and private customers. Of additional importance, is the fact that the presence of harmonics or over voltage on the power cycle will affect the nature of the generated partial discharges. Thus, being able to simultaneously monitor both the power cycle information and the occurrence of partial discharges is of critical importance in order to interpret and understand the power quality and the nature of partial discharge activity.

EN/IEC 60270 Partial Discharge Standard

An industry standard method for the measurement of partial discharges is contained within the EN/IEC 60270 Standard entitled "High Voltage Test Techniques—Partial Discharge Measurements" (2000). This standard prescribes the design and calibration of electrical circuits employed to measure partial discharges.

FIG. 1 shows a basic EN/IEC 60270 standard circuit 1 suitable for partial discharge measurement. In this figure $C_a$ represents the capacitance of the sample under partial discharge testing 2, $C_k$ a coupling capacitor 3, and $Z_m$ an impedance 4 which allows partial discharge current pulses to be shaped for measurement. $Z_m$ 4 can take on many forms from a simple resistor R, through to filters involving RC and RLC combinations. There are also many designs known to those skilled in the art for EN/IEC 60270 detection circuits based on narrowband and wideband filter designs of various orders. Narrowband filter circuits generally respond to fast impulse partial discharges by producing a slow damped waveform response output whereas wideband systems produce faster output waveform responses.

Generally, EN/IEC 60270 sensors are calibrated by injecting a known fast rise-time step input voltage across a calibration capacitor resulting in a known charge injection, $Q_{cal}$, through the capacitor into the measurement circuit. This produces a damped or oscillatory waveform at the output of the detector, the peak value, $V_{cal}$, representing a measure of the charge injection. The sensor is then calibrated in terms of its sensitivity, derived from $Q_{cal}/V_{cal}$, which is normally expressed in picoCoulombs per millivolt i.e. pC/mV. These signals are usually amplified and transmitted over a galvanic connection such as coaxial cable to a digital or analogue oscilloscope for measurement. When measurements of partial discharges are made on a sample under test, the detected peak value of the response signal is measured and this is multiplied by the sensitivity to produce the apparent charge in pC.

Although Standard EN/IEC 60270 sensors do provide for the detection of partial discharge signals they do not facilitate the extraction of power cycle information.

Further Partial Discharge Monitoring Apparatus

There exist a number of prior art documents that teach of alternative apparatus for measurement of partial discharges from electrical plant items, for example using high voltage bushing tap connections. For example U.S. Pat. No. 3,622,872 teaches of a method and apparatus for locating corona discharges in high-voltage, fluid filled electrical inductive apparatus. Within the described system any power cycle information is eliminated through filtering and is therefore not available for use. Thus the described apparatus does not facilitate the monitoring of simultaneous partial discharges and power cycle information from a single tap connection point.

Power Cycle Information Monitoring Apparatus

U.S. Pat. No. 4,757,263 teaches of a capacitance tap adapter which can be attached to any piece of high voltage equipment which has a bushing or capacitor tap e.g. a transformer, and is employed to evaluate the insulation power factor or intrinsic capacitance of the equipment. Any change in the internal insulation capacitance is detected through a change in the power factor. The measurement is taken when the equipment is on-line and connected at its operational high voltage. The capacitance tap adapter current (measured as a voltage) and the voltage taken from a separate voltage transformer connected to the equipment supply voltage are compared so as to calculate the power factor. Changes in the phase or amplitude of the signal from the capacitance tap adapter are indicative of insulation faults in the equipment/capacitance. The average, short or long term trends of the power factor can be monitored and alarms set off as appropriate.

The described capacitor tap adaptor intrinsically reduces partial discharge signals by a significant level due to the capacitive divider design of the tap adaptor. In addition the signals are further low-pass filtered so as to specifically eliminate high frequencies signals. As a result the described tap adapter does not provide for the measurement of partial discharges and certainly not the simultaneous measurement from a single tap connection of these discharges with the power cycle information signal.

An additional drawback of the described system relates to the fact that if both capacitors of the capacitance tap adaptor were to fail then there is no further safety mechanism to prevent damage to the high voltage apparatus or the attached instrumentation connected to the measurement cable.

An alternative method for monitoring power cycle information is described within U.S. Pat. No. 6,028,430. This patent teaches of a method of evaluating the bushing capacitance of a transformer through monitoring the bushing tap voltage for small and large problems e.g. short circuits etc. The method comprises the direct measurement of the reduced power cycle voltage from three bushing taps of a transformer and monitoring any changes, storing these changes and their respective times of occurrence, determining the time difference between at least two changes and generating error signals (through fuzzy logic means) corresponding to the frequency or characteristics of the changes. The changes in the reduced voltage are a measure of partial disruptive discharge (not partial discharges but short circuits of capacitor foils) within the bushing which can be monitored. Irregular or atypical signals can be detected. The signals between phases can also be monitored for variations.

As such U.S. Pat. No. 6,028,430 does not facilitate partial discharge measurements; the described method only looks for changes in capacitor tap power voltage levels. Simultaneous partial discharge and changes in power cycle voltage cannot therefore be made with this system. Two measurements taken simultaneously merely provide more information on the nature of the bushing capacitor fault.

Splitters

Figure 2:
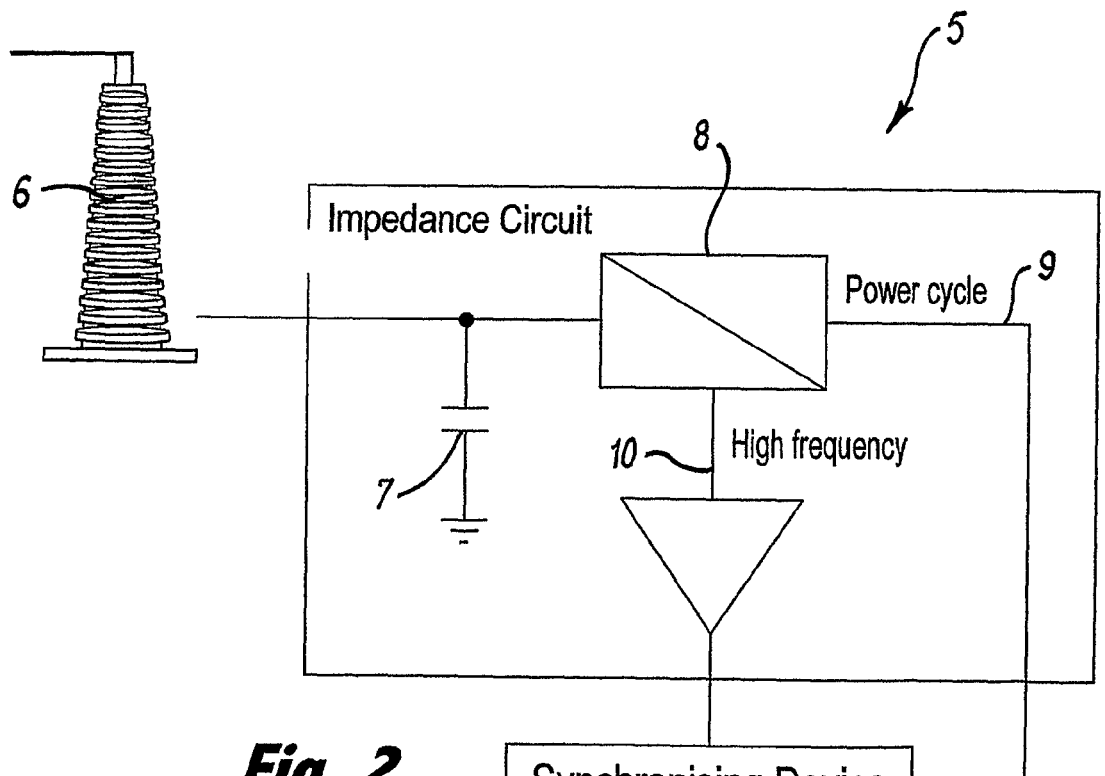

Splitters are known to those skilled in the art for splitting an electrical signal into separate AC and high frequency components. One such conventional splitter 5 is shown in FIG. 2. The AC voltage output at the bushing tap 6, and the partial discharge signals, are reduced in voltage to a smaller level e.g. AC to 5V, through a shunt capacitor 7 before being split in a splitter 8 into an AC power cycle information component 9 and a high frequency component 10 that corresponds to the occurrence of partial discharges. The high frequency component 10 is typically in μVs and is therefore required to be amplified. Both the AC power cycle information 9 and the partial discharge signals 10 can be synchronised to get the time of the discharge in relation to the power cycle.

The conventional splitter 5 suffers from the following problems. Firstly, the partial discharge signals 10 are attenuated significantly due to the presence of the shunt capacitor 7 prior to any conditioning impedance measurement. As a result this signal requires amplification. However, the signal conditioning of these signals is often difficult due to their small magnitude. In addition, if interested in high frequencies the design of any amplifier must be capable of amplifying well into the high hundreds of MHz and beyond. As a result the sensitivity of the conventional splitter 5 is limited, as the original partial discharge high frequencies are attenuated by the shunt capacitor 7.

An alternative splitter is described in U.S. Pat. No. 5,247, 258 which teaches of a system for measuring partial discharges and in particular a partial discharge detection system which also incorporates a power cycle monitor. A drawback of the described system is that it requires the employment of two separate connection points to provide the power cycle information and the partial discharge signal. Furthermore, the described apparatus comprises a capacitive divider that limits the sensitivity of the partial discharge detection across the impedance element since the collective reactance of the capacitive divider provides a low impedance path for high frequency partial discharges signals.

U.S. Pat. No. 6,313,640 teaches of a further alternative to the conventional splitter 5. Here the power cycle information is monitored through the attachment of a shunt capacitor, as described above. However the partial discharge signal is monitored using a current transformer around the connector between the bushing tap and the shunt capacitor. The current transformer typically has a response up to 25 MHz. The partial discharge signal is passed through an appropriate low pass filter so as to eliminate noise and is then amplified. A tuning circuit is used to compensate the power cycle measurement for any capacitance and inductance effects of the bushing and the power transformer.

In practice it is found that the current transformer produces only an inductively transformed signal which is reduced in frequency content. It does not enable the integrated charge of the partial discharge to be evaluated effectively as the response of the current transformer is frequency limited. Two separate connections are also required i.e. a connection to the tap point for the AC cycle, and secondly a connection from the current transformer to monitor partial discharge. In addition, current transformer detection does not provide an evaluation of the apparent charge associated with any discharge as the relationship between current transformer signals and the actual charge involved in the partial discharge measurement is not well established.

Figure 3:
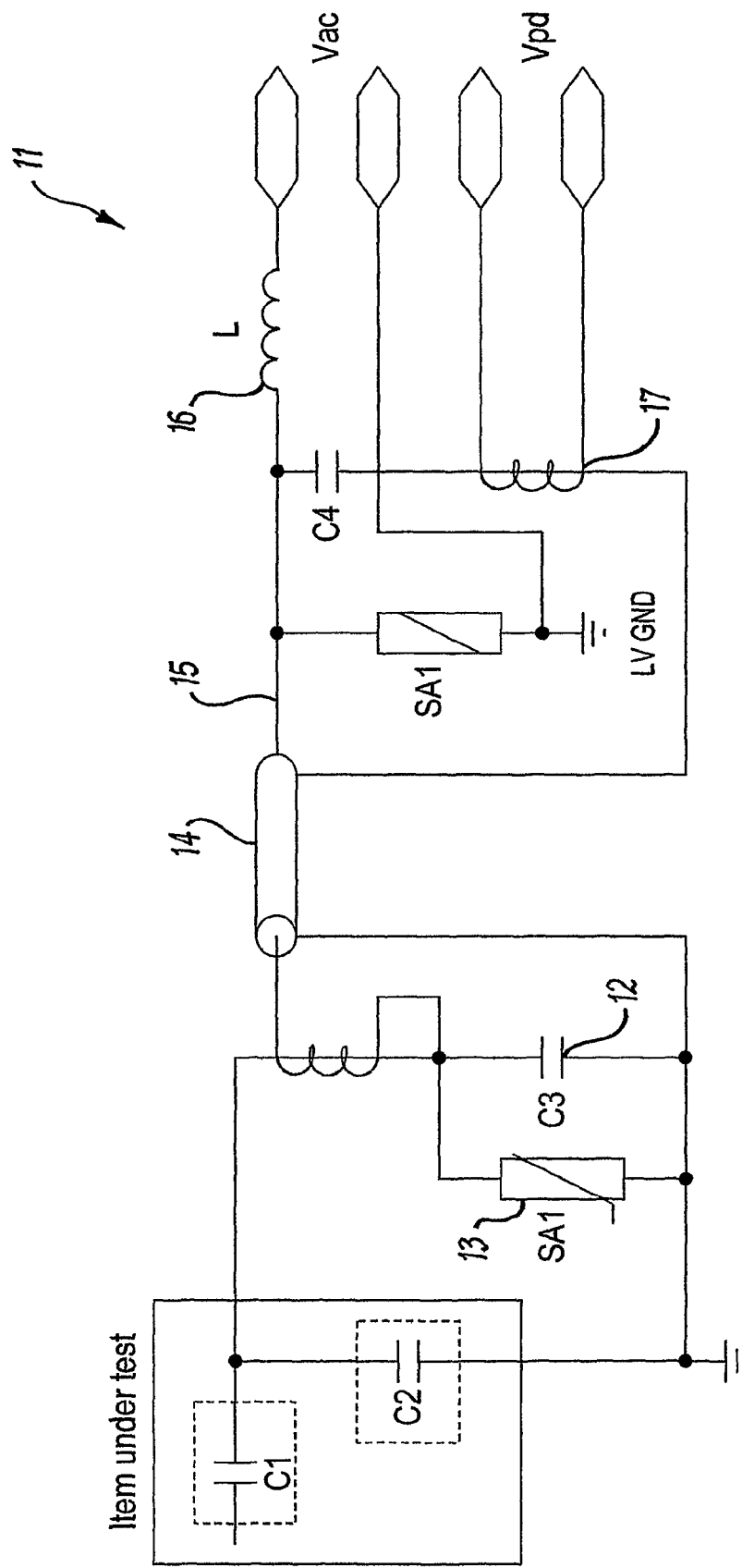

There exists a large body of prior art documents that employ capacitor taps in order to extract both AC power cycle information and high frequency signals associated with partial discharge events, see as an example capacitor tap circuit 11 of FIG. 3, as described in detail within U.S. Pat. No. 6,433,557, U.S. Pat. No. 6,489,782 and U.S. Pat. No. 6,504, 382. In this capacitor tap circuit 11 a standard shunt capacitor $C_3$ 12 in parallel with a protection surge arrester 13 is employed to detect the AC power cycle information. An isolation current transformer 14 is connected between the output tap or sensor of the equipment under test and the shunt capacitor 12.

Within such circuits one end of the current transformer 14 is connected to the top of the shunt capacitor 12 and the other to the connecting cable 15 which transmits the signal to the measuring instrumentation. This arrangement allows the AC power cycle information and the high frequency partial discharge signals to be transmitted together down the cable 15 for subsequent measurement. At the measurement end, an inductor 16 is used to separate off the AC signal as long as the magnitude of its impedance is much lower than that of capacitor $C_4$. A second isolation current transformer 17 is used to extract the high frequency partial discharge signals for separate measurement.

A significant disadvantage to those circuits which employ current transformers is that a current transformer does not provide a measure of the apparent charge involved in the discharge current event at the measuring point itself. Current transformers are also only useful in responding to high frequency signals within a limited bandwidth, that often less than 25 MHz. Since partial discharge signals comprise significantly higher frequencies, then the current transformers will normally only provide limited frequency range information thus providing only limited interpretation of the discharge events.

A second disadvantage of these circuits relates to the superimposing of both the AC power cycle information and the partial discharge signals. This superposition can cause high signal level problems at the receiver as the addition of the two signals can swamp the receiver.

A further problem associated with these circuits relates to electrical safety and isolation for a user. If a major fault develops in the circuit 11 and the surge arrestor 13 and shunt capacitor 12 fail, then high voltage may be transmitted to the remote instrumentation with obvious safety implications for the user.

Bushing Tap Switches

Bushing tap switches are alternative apparatus known to those skilled in the art for switching in measurement equipment attached to a high voltage plant tap connector. An example of a bushing tap switch is described in U.S. Pat. No. 6,580,276 wherein the tap switch is attached to each bushing of a power transformer. This set up allows diagnostics of the transformer to be carried out when the transformer is operational and on-line. Basically, the bushing tap switch consists of two independent switches with each switch opened and/or closed appropriately to enable or disable connection of the measurement equipment. Diagnostics can be performed when the measurement system is switched in allowing assessment of the transformer as required. This allows for partial discharge measurements and frequency response measurements to be made to make an early assessment of the working state of the transformer. This solution provides cost and time saving when compared with the alternative of shutting down and disconnecting the connection to the bushing tap.

A significant drawback of the above described bushing tap switch is the fact that the ground connection of the equipment under test (e.g. a transformer) and the measurement equipment are directly connected together. Thus, there is no isolation between the measurement equipment and the transformer tap unless the system is disconnected completely. Furthermore, the bushing tap switch requires the employment of two independent switches, the first switch connects the bushing tap to ground whilst the second provides an open circuit disabling and isolating the measurement system. It therefore requires both switches to operate successfully for enabling and disabling the monitoring system connection. If one switch fails then the tap switch becomes inoperable and may result in the diagnostic equipment connection being permanently on-line.

It can be seen that in terms of health and safety concerns the ability to obtain electrical isolation between any monitoring apparatus (inclusive of any associated power supplies) and the high voltage source to be tested is of paramount importance. Often condition monitoring sensors and instrumentation require power which is supplied via an electrical cable from either an isolated power supply or through batteries. The problem with this arrangement is that power surges or faults on a piece of high voltage plant can cause serious problems. In the first instance, earth path problems can occur, where the earth line rises significantly in voltage causing instrumentation attached to any sensor to be irreparably damaged or a user to be electrocuted through contact with the earth line.

Secondly, the supply voltage line can fault causing it to rise to a high voltage again resulting in damage to the power supply providing the power or to the user who is unaware of the existence of high voltage on any supply cable connected to the sensor.

A further problem with employing batteries is that they still require a galvanic cable connection and must be recharged or replaced. Again if a fault occurs in the high voltage plant this presents a safety concern for the operator who changes or charges the batteries.

It is an object of an aspect of the present invention to provide a high voltage insulation monitoring sensor that is capable of simultaneous measurement of partial discharge signals and power cycle information via a single connection point with high voltage source.

It is a further object of an aspect of the present invention to provide a high voltage insulation monitoring apparatus that is capable of evaluating, assessing and classifying partial discharge signals from a high voltage source.

A yet further object of an aspect of the present invention is to provide a high voltage insulation monitoring apparatus that provides for electrical isolation for a user, remote powering and the remote disabling of the monitoring apparatus itself when the apparatus is connected to a high voltage source.

According to a first aspect of the present invention there is provided an impedance measurement unit for use within a high voltage insulation monitoring sensor the impedance measurement unit comprising an input channel for receiving an input voltage signal;

a first branch containing a first set of electrical components which exhibit a first impedance to one or more partial discharge signals contained within the input voltage signal; and a second branch, electrically parallel to the first branch, comprising a second set of electrical components that exhibits a second impedance to the one or more partial discharge signals contained within the input voltage signal;

wherein a magnitude of the first impedance is greater than a magnitude of the second impedance such that the one or more partial discharge signals are preferentially transmitted through the second branch.

Most preferably the first set of electrical components exhibits a third impedance to a power cycle information signal contained within the input voltage signal while the second set of electrical components exhibit a fourth impedance to the power cycle information signal wherein a magnitude of the fourth impedance is greater than a magnitude of the third impedance such that the power cycle information signal is preferentially transmitted through the first branch.

Most preferably the second set of electrical components comprises a multiple order bandpass filter the output of which is responsive to input changes of the one or more partial discharge signals.

Optionally the second branch further comprises a second branch amplifier arranged to amplify the one or more partial discharge signals.

Preferably the first branch further comprises a low frequency bandpass filter arranged to filter noise from the power cycle information signal.

Optionally the first branch further comprises a first branch amplifier arranged to amplify the power cycle information signal.

Preferably the first set of electrical components comprises a first inductor and a first capacitance arranged in series within the first branch. Alternatively, the first set of electrical components comprises a first inductor and a first resistor arranged in series within the first branch.

Most preferably the impedance measurement unit further comprise one or more surge arresters incorporated in parallel with the first and second branches so as to provide protection from transient voltage surges for the components within the first and second branches.

Most preferably the impedance measurement unit further comprises a switch, located in electrical parallel with the first branch, wherein when the switch is activated it moves from an open position to a closed position such that the input channel is electrically connected to the first and second branches.

Preferably the switch comprises a relay switch selected from a group comprising an electromechanical, opto-mechanical, MEMS and solid-state switch.

Preferably the impedance measurement unit further comprises a third branch, electrically parallel to the first branch, comprising a third set of electrical components which exhibit the first impedance to one or more partial discharge signals contained within the input voltage signal.

Most preferably the third set of electrical components exhibits the third impedance to a power cycle information signal contained within the input voltage signal.

Optionally the third set of electrical components comprises a second inductor and a second capacitance arranged in series within the third branch. Alternatively the third set of electrical components comprises a second inductor and a second resistor arranged in series within the third branch.

According to a second aspect of the present invention there is provided an opto-electronic circuit for controlling an impedance measuring unit the optoelectronic circuit comprising an optical light source employed to optically communicate with an opto-electric power converter, one or more electro-optic converters arranged to obtain power from the opto-electric power converter wherein the one or more electro-optic converters convert an electrical output from the impedance measuring unit to an optical signal for transmission to a location remote from the impedance power unit.

Preferably the optoelectronic circuit further comprises a first optical fibre wherein the first optical fibre connects the optical light source to the opto-electric power converter.

Preferably the optoelectronic circuit further comprises one or more second optical fibres wherein the one or more second optical fibres connects the one or more electro-optic converters to the remote location.

Most preferably the opto-electric power converter provides a means for powering one or more components of the impedance measuring unit.

According to a third aspect of the present invention there is provided a high voltage insulation monitoring sensor comprising
an impedance measuring unit in accordance with the first aspect of the present invention,
an optoelectronic circuit in accordance with the second aspect of the present invention, and
a data measurement system remotely connected to the impedance measuring unit via the optoelectronic circuit.

Most preferably the sensor further comprises a connector that provides a means for electrically connecting the input channel of the impedance measuring unit to an electrical distribution and/or an item of plant.

Preferably the opto-electric power converter provides a means for remotely activating a single relay switch, or two or more relay switches in parallel.

Preferably the opto-electric power converter provides a means for powering the first and/or second branch amplifiers.

Figure 4:
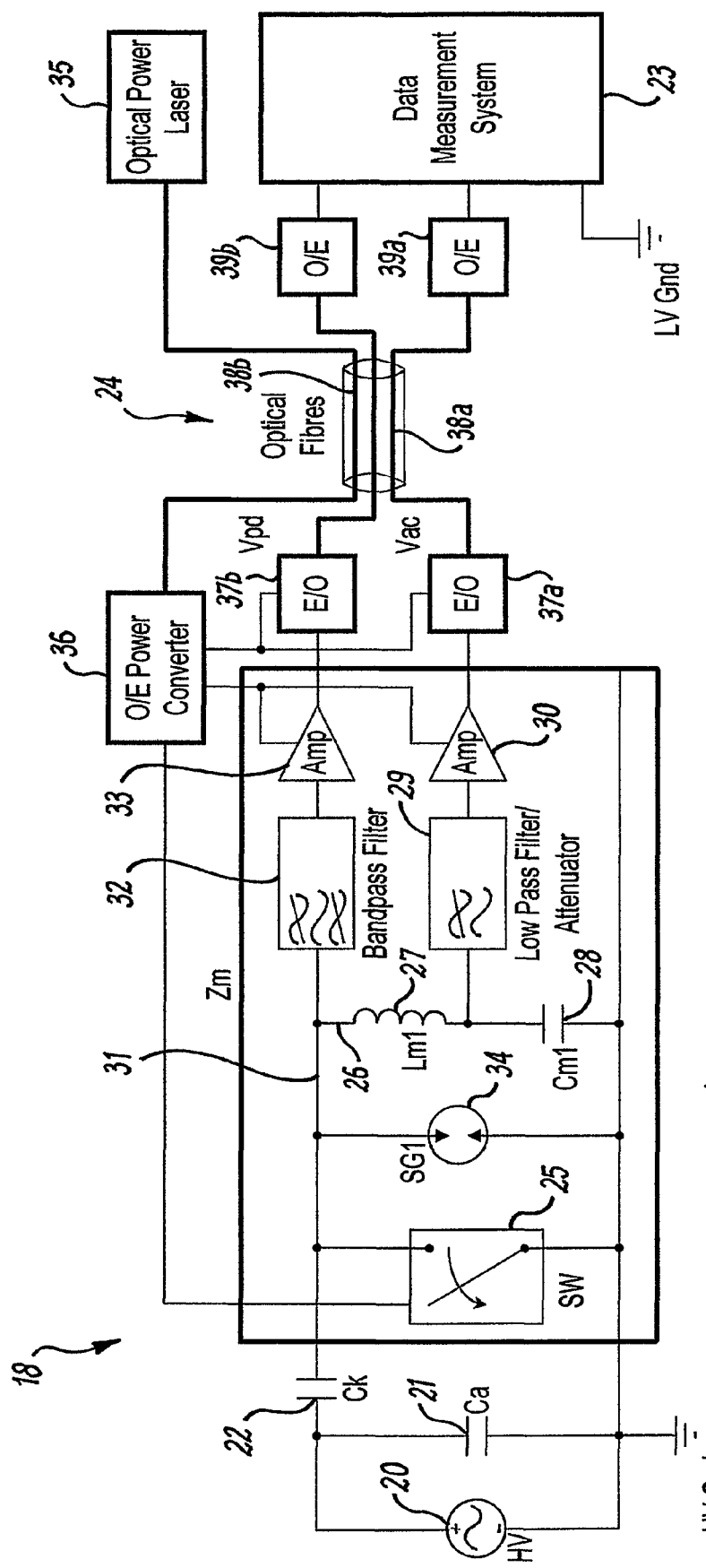

Embodiments of the present invention will now be described by way of example only with reference to the accompanying figures, in which:

FIG. 1 presents an electrical circuit of a basic EN/IEC 60270 standard circuit employed for partial discharge measurement;

FIG. 2 presents an electrical circuit of a conventional AC power cycle information and partial discharge signal splitter;

FIG. 3 presents an electrical circuit of a prior art capacitor tap employed to detect AC power cycle information and partial discharge signal;

FIG. 4 presents a high voltage insulation monitoring sensor in accordance with an aspect of the present invention;

FIG. 5 presents typical sensor output waveform responses, from left to right, for partial discharge input rise times of 1 ns, 100 ns, 200 ns, 500 ns and 1000 ns and where fall times are:
(a) significantly greater than the respective rise times; and
(b) equal to the respective rise times.

Figure 6:
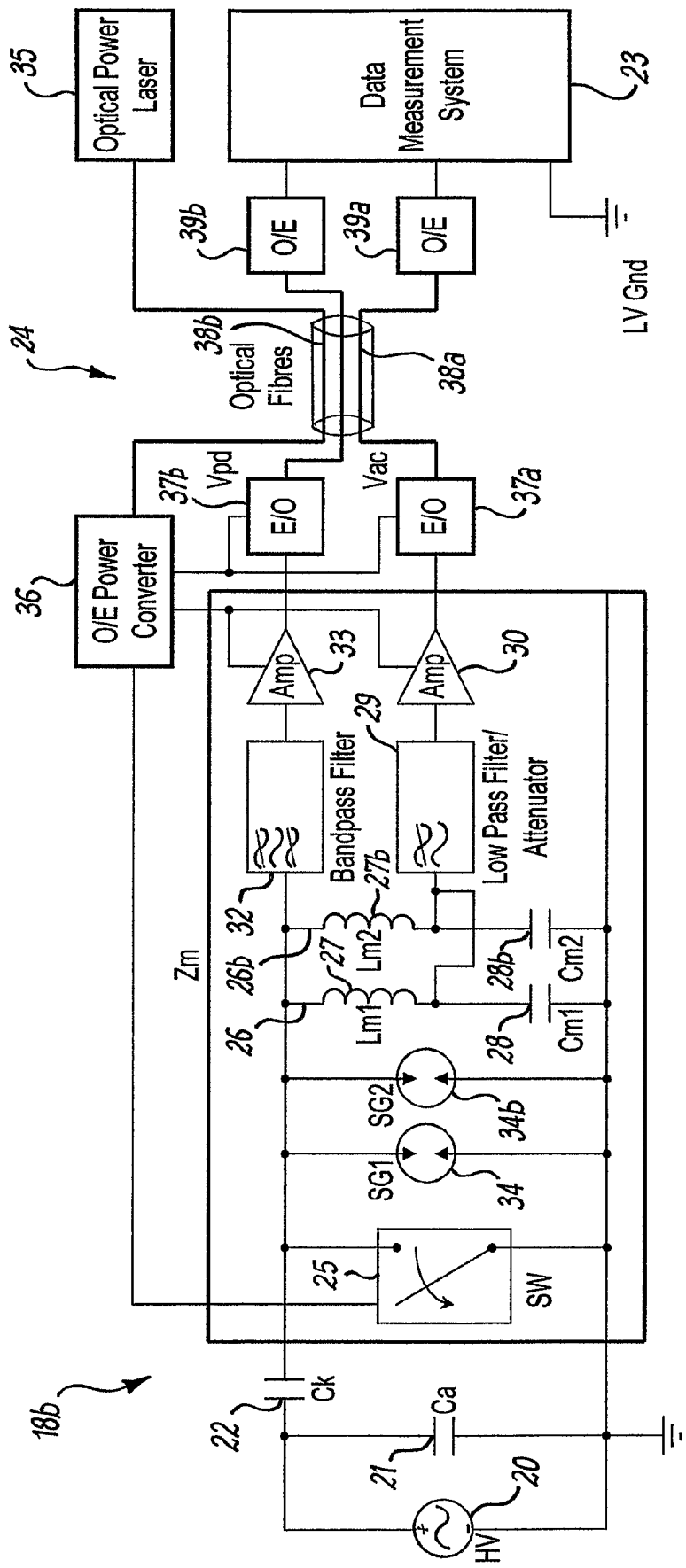
Figure 7:
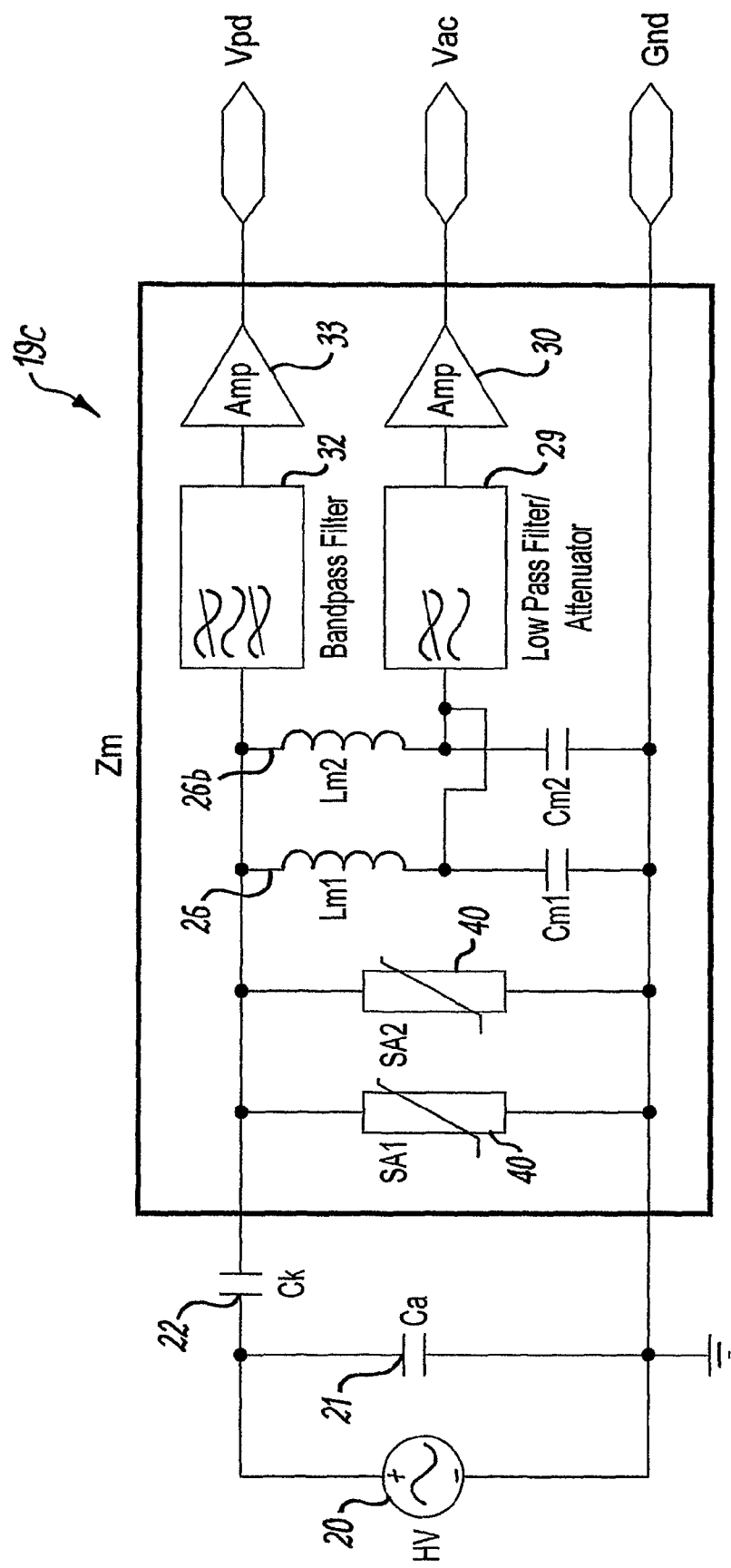
Figure 8:
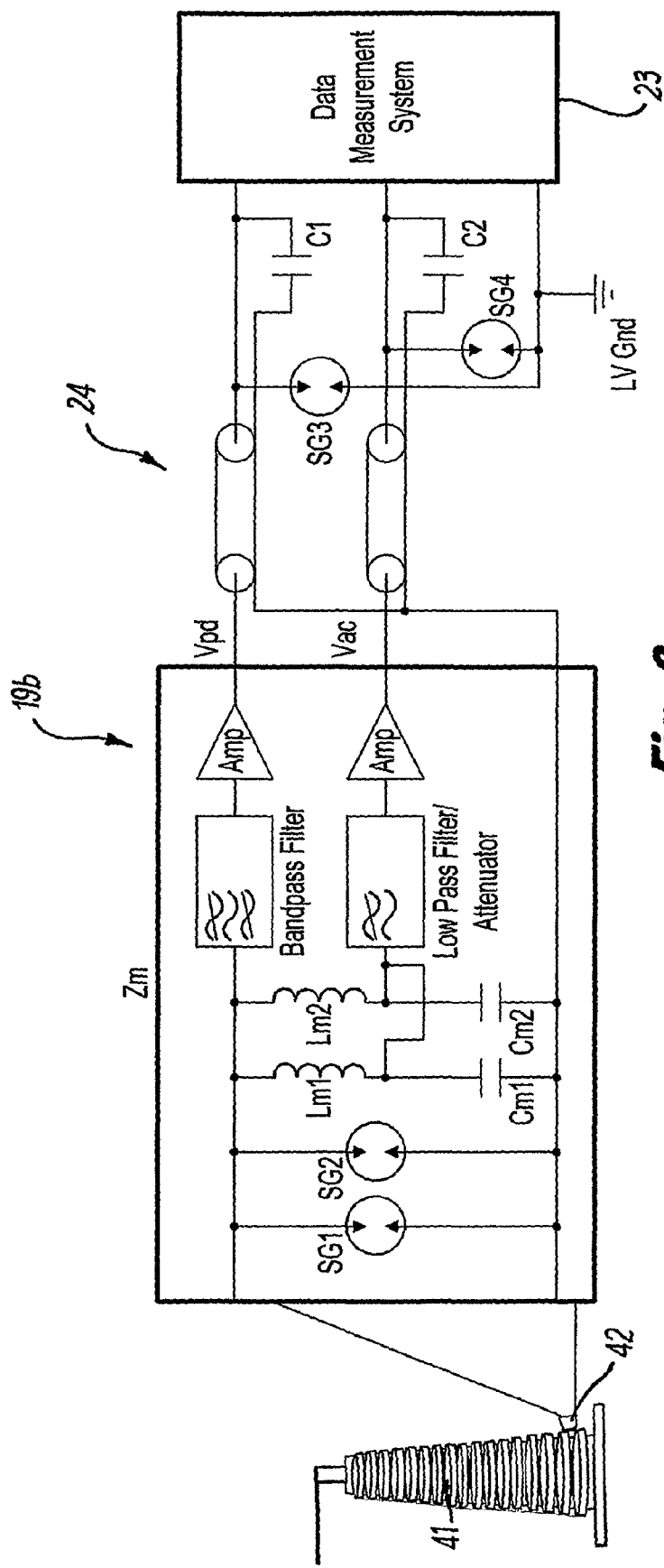

FIG. 6 presents an alternative embodiment of the high voltage insulation monitoring sensor;

FIG. 7 presents an alternative embodiment of an impedance measuring unit of the high voltage insulation monitoring sensor of FIG. 6; and FIG. 8 presents the high voltage insulation monitoring sensor of FIG. 6 attached for example to a bushing tap of a transformer.

FIG. 4 presents a high voltage insulation monitoring sensor 18 in accordance with an aspect of the present invention. The high voltage insulation monitoring sensor 18 can be seen to comprise an impedance measuring unit 19a that provides a means for monitoring and processing a high voltage signal from an electrical generation, transmission or distribution system or an item of plant 20. In this Figure $C_a$ 21 represents the capacitance of the electrical distribution or the item of plant to be tested. A coupling capacitor ($C_k$) 22 is also presented which corresponds to either the intrinsic capacitance of the item being monitored (e.g. a transformer bushing) or an attached high voltage capacitor connected to the plant item.

The impedance measuring unit 19a is connected to a data measurement system 23 via an opto-electronic circuit 24 that provides for power to be supplied to the various components of the high voltage insulation monitoring sensor 18 and for the relay of partial discharge signals ($V_{pd}$) and power cycle information ($V_{ac}$) to the data measurement system 23, as described in further detail below. Once received by the digital measurement system 23, standard FFT (Fast Fourier Transforms) signal processing techniques are employed so as to allow the power quality/harmonic content of the signals to be determined and the power cycle information to be monitored and evaluated. It will be appreciated by those skilled in the art that alternative signal processing techniques may equally well be employed to analyse the partial discharge signals and the power cycle information within the data measurement system 23.

One component that is powered by the opto-electronic circuit is a remote relay switch 25 located within impedance measuring unit 19a. The remote relay switch 25 can be of a variety of forms e.g. electromechanical, opto-mechanical, MEMS, solid-state etc. The operation of the remote relay switch 25 is also described in further detail below.

The impedance measuring unit 19a is designed to comprise a number of electrical components arranged in separate branches. Located within a first branch 26 of the presently described embodiment is an inductance $L_{m1}$ 27 that is placed in series with a capacitance $C_{m1}$ 28. The first branch 26 further comprises a low pass frequency filter 29 and a first branch amplifier 30. A second branch 31 comprises an nth order passive filter 32 (e.g. a Butterworth or Gaussian filter) and a second branch amplifier 33. A spark gap 34 is incorporated in parallel with the components of the first 26 and second branches 31 so as to provide protection for these components from large transient voltage surges.

The LC components 27 and 28 are chosen such that when an input signal contains a high frequency component, i.e. a partial discharge signal (having a frequency >1 MHz), then the series combination provides a high impedance path (~10 s of KOhms) to these signals and thus they are preferentially transmitted into the lower impedance (~100 Ohms) second branch 31. For low frequency signals, i.e. power cycle frequencies of 50 Hz or 60 Hz, the series LC combination, 27 and 28, provides a low impedance path (~100 Ohms) compared to the second branch (~10 s of kOhms) and so signals are preferentially transmitted through the first branch 26. In the presently described embodiment inductor $L_{m1}$ 27 has a value of 1 milliHenry while capacitor $C_{m1}$ 28 has a value of 20 µF. In this way, the partial discharge signal and the power cycle information (and its associated harmonics) are separated into the second 31 and first branches 26, respectively, so allowing for their independent simultaneous measurement from a single point of connection across $C_a$ 21, as described in further detail below. The output response from either the first 26 or second branch 31 can be further amplified prior to transmission for measurement by the first branch amplifier 30 or the second branch amplifier 33, respectively.

Power is provided to the various components of the high voltage insulation monitoring sensor 18 via the opto-electronic circuit 24. This circuit comprises an optical fibre laser 35, capable of providing 5 Watts of power, that is connected to an opto-electrical power converter 36. Between the output of the first branch amplifier 30 and the data measurement system 23 are located a first electro-optic converter 37a, a first optical fibre 38a and a first opto-electric converter 39a. Similarly, a second electro-optic converter 37b, a second optical fibre 38b and a second opto-electric converter 39b are also located between the output of the second branch amplifier 33 and the data measurement system 23.

The opto-electrical power converter 36 provides the power (~750 mW) to the electro-optic converters 37a and 37b so as to allow for the transmission of the power cycle information and the partial discharge signals through the optical fibres 38a and 38b, respectively, to their associated opto-electric converter 39a and 39b and onto the data measurement system 23.

From FIG. 4 it can be seen that the opto-electrical power converter 36 also provides the required power (~150 mW) to operate the remote relay switch 25. In practice the remote relay switch 25 operates as follows. On power up, the power applied to the remote relay switch 25 automatically switches the device into an enabled sensor state. On power down, the control voltage automatically switches the remote relay switch 25 into a disabled or short circuit sensor state. Thus, the function of the remote relay switch 25 is to engage the impedance measuring unit 19a so as to allow measurements to be made, or to switch it out providing a short circuit across the input of the impedance measuring unit 19a. This latter condition effectively allows the item under test to function with no sensor in situ and therefore in its normal operational state.

A secondary function of the remote relay switch 25 is that as it provides a zero impedance path in the disabled state it provides an additional level of safety for the components of the sensor 18 against very large transient currents which may arise during normal operation of the item under test when no measurements are actually being made. Effectively the sensor 18 is only enabled when measurements are required to be made otherwise the sensor is disabled or switched out of the circuit.

The employment of the opto-electronic circuit 24 provides for several significant advantages over circuits based solely on electrical components. In the first instance complete electrical isolation of the impedance measuring unit 19a when attached to the piece of high voltage item being condition monitored is achieved. In addition, the employment of the opto-electronic circuit 24 provides the ability to remotely power the components of the high voltage insulation monitoring sensor 18 using an electrically isolated means i.e. the optical fibre laser 35. Furthermore the optical fibre laser 35 and relay switch 25 combination allows for signals to be provided to the sensor 18 only when measurements are required to be made. Employing optical fibres 38a and 38b allows for power cycle information and partial discharge signals to be safely transmitted to the data measurement system 23 which can then be situated at a remote location. Finally, by employing optical fibres 38a and 38b to transmit the signals for measurement only one switching element is required. The switch 25 remains in the closed position until optical power up where it automatically switches to its open position thus enabling the sensor 18.

Measurement of Partial Discharge

One known problem for partial discharge measurement is that it is expensive to sample digitally, very fast pulses. To this end the second branch 31 of the impedance measuring unit 19a provides an impulse response output of an impedance so that the high frequency partial discharge signals can be converted into a slower response sinusoidal output thus allowing for measurement and analysis by inexpensive, slower sampling digital equipment i.e. those components located within the data measurement system 23.

It is the combined effects of the $n^{th}$ order bandpass filter 32 which in combination with the LC components, 27 and 28, of the first branch that effectively forms a bandpass filter which acts to integrate the partial discharge signal to produce the total charge involved in the partial discharge i.e. a measure of the apparent charge. In other words the LC components, 27 and 28, of the first branch 26 and the $n^{th}$ order bandpass filter 32 are designed to provide an overall bandpass filter. It is the design of this filter combination that is critical to ensure that the impedance measuring unit 19a is able to separate off the power cycle information, and its harmonics, into the first branch 26, and produce a high frequency partial discharge response pulse, the peak value of which describes the apparent charge, within the second branch 31.

In addition, it has been found that through appropriate design of the $n^{th}$ order bandpass filter 32 that the measurement of the partial discharge signal can be made sensitive to input changes of the input partial discharge currents. Partial discharges, as well as transient noise signals, can vary in relation to their rise-time and fall-time. These changes are indicative of different partial discharge source mechanisms or even different locations of partial discharges occurring in a sample or piece of plant under test, the latter often giving rise to slower rise and fall times for partial discharge events due to propagation losses in a measured system. Thus, the $n^{th}$ order bandpass filter 32 has been chosen since its intrinsic response is sensitive to changes in the input partial discharge waveforms, but that these changes still lie within the domain of the digitising equipment of the data measurement system 23.

The impedance measuring unit 19a partial discharge output $V_{pd}$ can also be calibrated for different input waveform shapes i.e. fast rise times, fall-times etc. with key characteristics of the output waveform determining the form of the input signal. Key characteristics which have been used to characterise the output waveform shape include the number of peaks (N), the peak values ($V_{p1}$, $V_{p2}$ etc.), the peak time values referenced from the start of waveform ($T_{p1}$, $T_{p2}$ etc.), the zero-crossing times referenced from the start of waveform ($T_{z1}$, $T_{z2}$, etc) and the total waveform duration ($T_d$). From these values other normalised evaluations can be made in order to characterise output waveform classifications and help monitor or determine waveform shape variations. For example, the following parameters have been employed to describe and characterise the waveform shape and its variability:

Ratio of peak signal values i.e. $V_{p2}/V_{p1}$, $V_{p3}/V_{p1}$, $V_{p3}/V_{p2}$ etc.

Ratio of times of peak values i.e. $T_{p2}/T_{p1}$, $T_{p3}/T_{p1}$, $T_{p3}/T_{p2}$ etc.

Ratio of zero crossing times i.e. $T_{z2}/T_{z1}$, $T_{z3}/T_{z1}$, $T_{z3}/T_{z2}$ etc.

Ratio of peak times to total waveform duration i.e. $T_{p1}/T_d$, $T_{p2}/T_d$ etc.

Ratio of zero crossing times to total waveform duration i.e. $T_{z1}/T_d$, $T_{z2}/T_d$ etc.

The above parameters, and measurement of their variations, provide a means of evaluating, assessing and classifying partial discharge signals measured by the sensor 18.

Figure 5A:
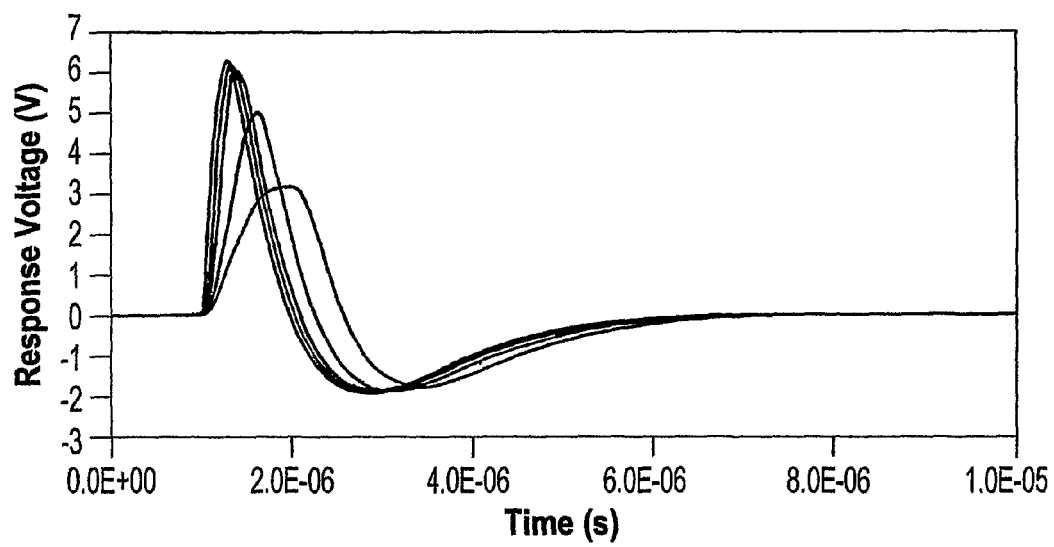
Figure 5B:
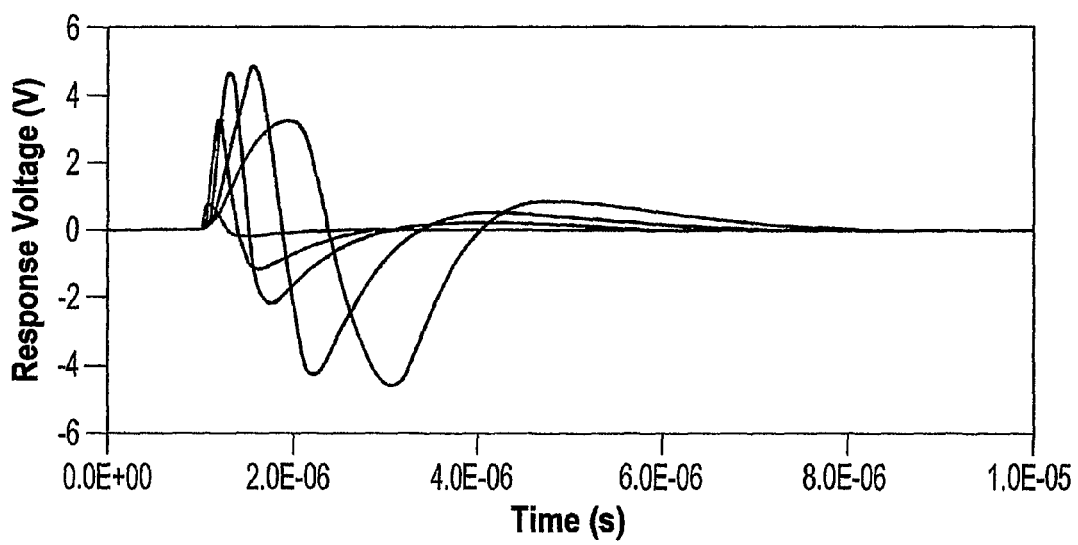

Examples of typical output waveforms for different input rise and fall time signals representing different partial discharge signals are shown in FIG. 5. In particular, FIG. 5(a) shows the influence on the output waveform $V_{pd}$ for partial discharge input rise times of 1 ns, 100 ns, 200 ns, 500 ns, and 1000 ns, and fall-times which are very much larger than these respective rise-times. In this figure the waveforms are damped and broadened as the rise time increases. Thus, the largest peak signal waveform corresponds to the 1 ns rise time and the lowest peak signal corresponds to the 1000 ns rise time. Alternatively, FIG. 5(b) displays the variations of the output waveform for symmetrical partial discharge signals i.e. those with the same rise and fall time. The values of rise and fall times for the waveforms in FIG. 5(b) are 1 ns, 100 ns, 200 ns, 500 ns and 1000 ns. In this figure the waveform durations increases with increasing rise and fall times. For example, the shortest duration waveform corresponds to the 1 ns rise and fall times, and the longest duration waveforms corresponding to the 1000 ns rise and fall times.

In both cases, the waveform shapes can be deigned to be of a much shorter duration if required (e.g. covering down to 100 ps), dependent on the cost or expense of the data sampling which is to be utilised. The waveforms shown in FIGS. 5(a) and 5(b) clearly show that differences in the key characteristic shape parameters of the output waveforms, as defined above, reflect and classify different forms of changes occurring at the input either from different partial discharge mechanisms or from partial discharge signals which have lost significant energy after propagating through windings etc.

Measurement of Power Cycle Information

As described above, the design of impedance measuring unit 19a is such that the current from the power cycle information passes through the LC components 27 and 28 located within the first branch 26 due to its low resistance path within the circuit design. The voltage across $C_{m1}$ 28 is fed off as a measure of the power cycle and before being passed through the low pass filter 29 so as to remove excess noise. This voltage, through design can be made to lie within an appropriate range for measurement. In practice ranges from less than 1 V through to a few volts have been employed. It should also be noted that through careful design, the voltage across $C_{m1}$ 28 is precisely in phase with the power cycle information.

FIG. 6 presents an alternative embodiment of the high voltage insulation monitoring sensor 18b. This embodiment is similar to that presented in FIG. 4, and described in detail above. However, in this embodiment the impedance measuring unit 19b further comprises a third branch 26b, in parallel to the first branch 26, that comprises an inductance $L_{m2}$ 27b and a capacitance $C_{m2}$ 28b. In addition a second spark gap 34b is also incorporated in parallel with the components of the first 26, second 31 and third branches 26 so as to provide additional protection for the various components from transient voltage surges. Thus, if one of the spark gaps 34 were to fail then there still exists a back-up protection facility.

In a similar manner to the first branch 26, the third branch 26b exhibits a high impedance (~10 s of kOhms) to high frequency signals i.e. partial discharge signals (with frequencies >1 MHz). Employment of the third branch 26b merely allows for the potential failure of one of the inductance components, 27 or 27b, or the capacitance components, 28 and 28b, while still allow the high voltage insulation monitoring sensor 18b to function correctly.

FIG. 7 presents an alternative embodiment of the impedance measuring unit 19c of the high voltage insulation monitoring sensor of FIG. 6. In this embodiment the spark gaps 34 have been replaced with MOV surge arresters 40. It will be appreciated by those skilled in the art that the spark gaps 34 or MOV surge arresters 40 may alternatively be replaced by any other suitable form of surge arrester.

The high voltage insulation monitoring sensor 18 or 18b can be connected directly to the bushing tap of other high voltage equipment such as power transformers, or within any typical EN/IEC60270 measurement arrangement. An example of transformer 41 attachment is demonstrated in FIG. 8, where the bushing of the transformer 41 provides the coupling capacitance (normally associated with the impedance measuring unit 19b) as well as a shunt capacitance to ground. Connection of the impedance measuring unit 19b is through a suitable tap connector box 42. This arrangement allows partial discharge to be synchronised with the relevant phase of the transformer 41. The power cycle information can also be monitored simultaneously for power quality or variations in the bushing capacity.

A number of alternative embodiments to those already described may also be adopted. For example, the capacitance elements $C_m$, 28 and 28b, of the first 26 and third branches 26b may alternatively comprise a resistance element $R_m$. The critical factor is again that the series LR components are chosen such that when a signal contains a high frequency component, i.e. a partial discharge signal, then the combination provides a high impedance path to these signals and they are fed into the lower impedance second branch 31. It should be noted that in the case of an LR combination, the voltage across R is fed off as a measure of the power cycle. This voltage through proper choice of can be 90° out of phase with the power cycle. Appropriate phase shift circuitry is then required to be incorporated if the signal processing technique requires a zero phase shift.

In a further embodiment, the relay switch 25 may be replaced by two or more relay switches in parallel. This allows further redundancy for the sensor enabling/disabling switch. If one switch fails to close the other provides the disabling of the sensor. If one switch fails to open, then the sensor is still safely and permanently disabled.

In the above described embodiments, the opto-electronic circuit 24 provides the required power supply for all of the components of the sensor 18. It will be appreciated by those skilled in the art that batteries could be used as an alternative source of power for one or more of the components of the sensor 18 e.g. the amplifiers 30 and 33. However, the disadvantage of having to recharge batteries within high voltage environments, as well as the limited time provision of power available from battery supplies makes such an option less favourable.

It is further noted that the principles of the optoelectronic circuit 24 may be applied directly to power many of the previously described prior art systems. For example the optoelectronic circuit 24 can be incorporated with the standard EN/IEC60270 systems of FIG. 1 where the partial discharge signal across impedance $Z_m$ 4 can then be safely transmitted through an optical fibre.

Although described in relation to the monitoring of a high voltage transformer the sensor can be similarly employed to monitor the existence and variability of fast current pulses on any other equipment. Some example equipment includes, but is not limited to, electrochemical drilling monitoring, electrical machine discharges and transient pulses on voltage supply lines.

The above described high voltage insulation monitoring sensor exhibits several advantages over those systems known in the art. In the first instance the described sensor only requires a single point of connection and provides a measurement system that allows for the simultaneous measurement of partial discharge signals and power cycle information across the sample under test (i.e. across $C_a$). The power cycle information can then be employed for phase referencing of partial discharges events so as to allow for the further interpretation and characterisation of these signals. This is achieved without the need for expensive equipment to monitor variations in individual partial discharge events. Changes in the nature of individual partial discharge events can be categorised by changes in characteristic waveform shape parameters of the sensor output.

The power cycle information can also be employed for quality monitoring of the power cycle. This provision also eliminates the requirement of many of the present commercial partial discharge systems for the phase reference to be taken from another source e.g. a local mains supply. Since the phase reference from a separate independent source normally provides a phase shift which is not accurately known, interpretations based on these incorrect phase references are often found to be erroneous. It is therefore of obvious benefit to be able to obtain a simultaneous measurement of the power cycle information.

Furthermore, it will be readily apparent to those skilled in the art that if multiple attachment points are available (e.g. multiple bushings of a transformer) on a particular test sample then multiple points of monitoring of the 50 Hz power cycle information across the test sample can be obtained by employing multiple high voltage insulation monitoring sensors. The employment of multiple connection points for simultaneously monitoring of the power cycle information of a test sample can then be used as a further diagnostic for monitoring the correct operation of the connection points of the test sample.

Consider the case where three or more bushings of a transformer are monitored simultaneously by three or more high voltage insulation monitoring sensor. A change in a bushing's bulk properties is indicated by a change in the measured voltage and/or the phase of the corresponding 50 Hz power cycle information. Thus, when three or more bushings are monitored simultaneously the relative change in the bulk capacitance (or tan Δ) of any one of the bushings can be identified. If this relative change is above a predetermined level then this is indicative that a fault has developed and that remedial action is required to be taken.

The employment of remote powering through fibre optic technology also offers additional advantages. In particular such an arrangement provides for improved electrical isolation for a user between the high voltage apparatus under test and the sensor itself.

In a similar manner the employment of the remote relay switch provides for the automatic enabling/switching of the sensor system only when sensor power up occurs i.e. when measurements are required to be taken. The remote relay also automatically disables or short circuits the sensor system at sensor power down to further protect the sensor from the consequences of transient surges and over voltages which normally occur during long term operation of the plant item or sample under test. This also has the effect of prolonging the sensor's lifetime.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A high voltage insulation monitoring sensor for condition monitoring the high voltage insulation of an electrical system, comprising:
    an impedance unit adapted to separate discharge signals and power cycle information to enable measurement of the partial discharge signals and the power cycle information, wherein the impedance unit comprises:
        an input channel directly electrically coupled to the electrical system for receiving an input voltage signal from the electrical system;
        a first branch containing a first set of electrical components which exhibit a first impedance to one or more partial discharge signals contained within the input voltage signal and which exhibit a third impedance to a power cycle information signal contained within the input voltage signal; and
        a second branch, electrically parallel to the first branch, comprising a second set of electrical components that exhibits a second impedance to the one or more partial discharge signals contained within the input voltage signal and exhibits a fourth impedance to the power cycle information signal,
    wherein a magnitude of the first impedance is greater than a magnitude of the second impedance such that the one or more partial discharge signals are transmitted through the second branch and a magnitude of the fourth impedance is greater than a magnitude of the third impedance such that the power cycle information signal is transmitted through the first branch; and
    wherein the first set of electrical components of the first branch comprise an inductor and capacitor in series, the second set of electrical components of the second branch comprise a multiple order bandpass filter, further wherein the inductor and capacitor, in combination with the multiple order bandpass filter, provide an overall bandpass filter to integrate the one or more partial discharge signals such that the second branch provides a measure of the apparent charge of the one or more partial discharge signals, and wherein the power cycle information signal is in phase with the input voltage signal in the first branch.

2. A high voltage insulation monitoring sensor as claimed in claim 1 wherein the second set of electrical components comprises a multiple order bandpass filter the output of which is responsive to input changes of the one or more partial discharge signals.

3. A high voltage insulation monitoring sensor as claimed in claim 2 wherein the second branch further comprises a second branch amplifier arranged to amplify the output of the multiple order bandpass filter.

4. A high voltage insulation monitoring sensor as claimed in claim 1 wherein the first branch further comprises a low frequency bandpass filter arranged to filter noise from the power cycle information signal.

5. A high voltage insulation monitoring sensor as claimed in claim 1 wherein the first branch further comprises a first branch amplifier arranged to amplify the power cycle information signal.

6. A high voltage insulation monitoring sensor as claimed in claim 1 wherein the first set of electrical components comprises a first inductor and a first capacitance arranged in series within the first branch.

7. A high voltage insulation monitoring sensor as claimed in claim 1 wherein the first set of electrical components comprises a first inductor and a first resistor arranged in series within the first branch.

8. A high voltage insulation monitoring sensor as claimed in claim 1 wherein the impedance measurement unit further comprises one or more surge arresters incorporated in parallel with the first and second branches so as to provide protection from transient voltage surges within the input voltage signal for the components within the first and second branches.

9. A high voltage insulation monitoring sensor as claimed in claim 1 wherein the impedance measurement unit further comprises one or more switches, located in electrical parallel with the first branch, wherein when the switch is activated the input channel is electrically connected to the first and second branches.

10. A high voltage insulation monitoring sensor as claimed in claim 9 wherein the switch comprises a relay switch selected from a group comprising an electromechanical, opto-mechanical, MEMS and solid-state switch.

11. A high voltage insulation monitoring sensor as claimed in claim 1 wherein the impedance measurement unit further comprises a third branch, electrically parallel to the first branch, comprising a third set of electrical components which exhibit the first impedance to one or more partial discharge signals contained within the input voltage signal.

12. A high voltage insulation monitoring sensor as claimed in claim 11 wherein the third set of electrical components exhibits the third impedance to a power cycle information signal contained within the input voltage signal.

13. A high voltage insulation monitoring sensor as claimed in claim 11 wherein the third set of electrical components comprises a second inductor and a second capacitance arranged in series within the third branch.

14. A high voltage insulation monitoring sensor as claimed in claim 11 wherein the third set of electrical components comprises a second inductor and a second resistor arranged in series within the third branch.

15. A high voltage insulation monitoring sensor as claimed in claim 1 wherein the high voltage insulation monitoring sensor further comprises an opto-electronic circuit for controlling the impedance unit.

16. A high voltage insulation monitoring sensor as claimed in claim 15 wherein the opto-electronic circuit comprises an optical light source employed to optically communicate with an opto-electric power converter, one or more electro-optic converters arranged to obtain power from the opto-electric power converter wherein the one or more electro-optic converters convert an electrical output from the impedance unit to an optical signal for transmission to a location remote from the impedance unit.

17. A high voltage insulation monitoring sensor as claimed in claim 16 wherein the opto-electronic circuit further comprises a first optical fibre wherein the first optical fibre connects the optical light source to the optoelectric power converter.

18. A high voltage insulation monitoring sensor as claimed in claim 16 wherein the opto-electronic circuit further comprises one or more second optical fibres wherein the one or more second optical fibres connects the one or more electro-optic converters to the remote location.

19. A high voltage insulation monitoring sensor as claimed in an claim 16 wherein the opto-electric power converter provides a means for powering one or more components of the impedance unit.

20. A high voltage insulation monitoring sensor as claimed in claim 15 wherein the high voltage monitoring sensor further comprises a data measurement system remotely connected to the impedance unit via the opto-electronic circuit.

21. A high voltage insulation monitoring sensor as claimed in claim 1 wherein the high voltage insulation monitoring sensor further comprises a connector that provides a means for electrically connecting the input channel of the impedance unit to an electrical distribution.

22. A high voltage insulation monitoring sensor as claimed in claim 1 wherein the high voltage insulation monitoring sensor further comprises a connector that provides a means for electrically connecting the input channel of the impedance unit to an item of plant.

23. A high voltage insulation monitoring sensor as claimed in claim 16 wherein the opto-electric power converter provides a means for remotely activating one or more relay switches.

24. A high voltage insulation monitoring sensor as claimed in claim 16 wherein the opto-electric power converter provides a means for powering a first branch amplifier.

25. A high voltage insulation monitoring sensor as claimed in claim 16 wherein the opto-electric power converter provides a means for powering a second branch amplifier.

* * * * *

UNITED STATES PATENT AND TRADEMARK OFFICE
CERTIFICATE OF CORRECTION

PATENT NO. : 8,466,690 B2
APPLICATION NO. : 12/065721
DATED : June 18, 2013
INVENTOR(S) : Stewart et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 949 days.

Signed and Sealed this
Eighth Day of September, 2015

Michelle K. Lee
*Director of the United States Patent and Trademark Office*